(12) United States Patent
Tadayon

(10) Patent No.: US 11,204,555 B2
(45) Date of Patent: Dec. 21, 2021

(54) METHOD AND APPARATUS TO DEVELOP LITHOGRAPHICALLY DEFINED HIGH ASPECT RATIO INTERCONNECTS

(71) Applicant: Intel Corporation, Santa Clara, CA (US)

(72) Inventor: Pooya Tadayon, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 826 days.

(21) Appl. No.: 15/857,308

(22) Filed: Dec. 28, 2017

(65) Prior Publication Data

US 2019/0204744 A1    Jul. 4, 2019

(51) Int. Cl.
| | | |
|---|---|---|
| G03F 7/20 | (2006.01) | |
| H01L 27/00 | (2006.01) | |
| G03F 7/30 | (2006.01) | |
| B05C 3/04 | (2006.01) | |

(52) U.S. Cl.
CPC .............. *G03F 7/2041* (2013.01); *B05C 3/04* (2013.01); *G03F 7/30* (2013.01); *G03F 7/3021* (2013.01); *H01L 27/00* (2013.01)

(58) Field of Classification Search
None
See application file for complete search history.

(56) References Cited

U.S. PATENT DOCUMENTS

| | | | | |
|---|---|---|---|---|
| 3,622,387 A | * | 11/1971 | Grandadam | .......... C13B 25/001 127/16 |
| 4,581,260 A | * | 4/1986 | Mawla | ................ C23C 18/1619 118/416 |
| 5,307,560 A | | 5/1994 | Aksu | |
| 5,453,701 A | | 9/1995 | Jensen et al. | |
| 5,592,222 A | | 1/1997 | Nakamura et al. | |
| 5,747,999 A | | 5/1998 | Yamaoka | |
| 5,767,692 A | | 6/1998 | Antonello et al. | |
| 5,917,329 A | | 6/1999 | Cadwallader et al. | |

(Continued)

FOREIGN PATENT DOCUMENTS

EP    0962776    12/1999

OTHER PUBLICATIONS

Darling, K.A. et al., "Mitigating grain growth in binary nanocrystalline alloys through solute selection based on thermodynamic stability maps", Computational Material Science; 84 (2014), 255-266.

(Continued)

*Primary Examiner* — Jethro M. Pence
(74) *Attorney, Agent, or Firm* — Essential Patents Group, LLP.

(57) ABSTRACT

An apparatus, comprising at least one vessel having a bottom and at least one sidewall extending from the bottom, wherein the at least one sidewall encloses an interior of the at least one vessel, a shaft has a proximal end and a distal end, wherein the distal end of the shaft extends into the interior of the at least one vessel, wherein the proximal end of the shaft is coupled to a motor, at least one support structure which extends laterally from the shaft; and a substrate attachment fixture on a distal end of the at least one support structure, wherein the at least one support structure and the substrate attachment fixture are within the interior of the at least one vessel.

18 Claims, 10 Drawing Sheets

(56) References Cited

U.S. PATENT DOCUMENTS

| | | | |
|---|---|---|---|
| 6,130,545 A | 10/2000 | Kiser et al. | |
| 6,292,004 B1 | 9/2001 | Kocher | |
| 6,356,090 B2 | 3/2002 | Deshayes | |
| 6,441,315 B1 | 8/2002 | Eldridge et al. | |
| 6,740,163 B1* | 5/2004 | Curtiss | B05C 3/04 118/423 |
| 6,812,718 B1 | 11/2004 | Chong et al. | |
| 7,189,077 B1 | 3/2007 | Eldridge et al. | |
| 7,436,193 B2 | 10/2008 | Crippen | |
| 7,566,228 B2 | 7/2009 | Chiu | |
| 7,884,632 B2 | 2/2011 | Shiraishi et al. | |
| 7,928,522 B2 | 4/2011 | Zhu et al. | |
| 8,029,291 B2 | 10/2011 | Park | |
| 8,267,831 B1* | 9/2012 | Olsen | B05C 3/04 475/269 |
| 8,411,550 B2 | 4/2013 | Chou et al. | |
| 9,227,324 B1* | 1/2016 | Abdul Rashid | H01L 21/67313 |
| 2002/0024347 A1 | 2/2002 | Felici et al. | |
| 2002/0163349 A1 | 11/2002 | Wada et al. | |
| 2005/0151547 A1 | 7/2005 | Machida et al. | |
| 2005/0231855 A1 | 10/2005 | Tran | |
| 2005/0263401 A1* | 12/2005 | Olsen | C25D 17/08 205/143 |
| 2006/0151614 A1 | 7/2006 | Nishizawa et al. | |
| 2006/0171425 A1 | 8/2006 | Lee et al. | |
| 2006/0214674 A1 | 9/2006 | Lee et al. | |
| 2007/0126435 A1 | 6/2007 | Eldridge et al. | |
| 2007/0126440 A1 | 6/2007 | Hobbs et al. | |
| 2007/0290371 A1 | 12/2007 | Chen | |
| 2008/0088327 A1 | 4/2008 | Kister | |
| 2008/0196474 A1 | 8/2008 | Di Stefano et al. | |
| 2008/0204061 A1 | 8/2008 | Chartarifsky et al. | |
| 2008/0231300 A1 | 9/2008 | Yamada et al. | |
| 2008/0309363 A1 | 12/2008 | Jeon et al. | |
| 2009/0219047 A1 | 9/2009 | Peterson et al. | |
| 2009/0237099 A1 | 9/2009 | Garabedian et al. | |
| 2010/0052715 A1 | 3/2010 | Beaman et al. | |
| 2010/0066393 A1 | 3/2010 | Bottoms et al. | |
| 2010/0079159 A1 | 4/2010 | Kemmerling | |
| 2010/0276572 A1 | 11/2010 | Iwabuchi et al. | |
| 2011/0031991 A1 | 2/2011 | Lee et al. | |
| 2011/0115513 A1 | 5/2011 | Harada | |
| 2011/0234251 A1 | 9/2011 | Komatsu et al. | |
| 2012/0038383 A1 | 2/2012 | Wu et al. | |
| 2012/0071037 A1 | 3/2012 | Balucani | |
| 2012/0100287 A1* | 4/2012 | Wong | C25D 21/10 427/127 |
| 2012/0117799 A1 | 5/2012 | Luo | |
| 2012/0319710 A1 | 12/2012 | Dabrowiecki et al. | |
| 2013/0002285 A1 | 1/2013 | Nelson et al. | |
| 2013/0099812 A1 | 4/2013 | Wang et al. | |
| 2013/0200910 A1 | 8/2013 | Ellis-Monaghan et al. | |
| 2013/0285688 A1 | 10/2013 | Namburi et al. | |
| 2014/0021976 A1 | 1/2014 | Tanaka | |
| 2014/0125372 A1 | 5/2014 | Fukasawa et al. | |
| 2014/0253162 A1 | 9/2014 | Wang | |
| 2014/0347085 A1 | 11/2014 | Kuo et al. | |
| 2014/0362425 A1 | 12/2014 | Stephens et al. | |
| 2014/0363905 A1 | 12/2014 | Mcshane et al. | |
| 2015/0123693 A1 | 5/2015 | Ota et al. | |
| 2015/0192633 A1 | 7/2015 | Garibay et al. | |
| 2016/0079635 A1 | 3/2016 | Niwa | |
| 2016/0178663 A1 | 6/2016 | Prabhugoud et al. | |
| 2017/0219626 A1 | 8/2017 | Gardell et al. | |
| 2018/0003767 A1 | 1/2018 | Crippa et al. | |
| 2019/0203370 A1 | 7/2019 | Walczyk et al. | |
| 2019/0212366 A1 | 7/2019 | Tadayon et al. | |
| 2020/0006868 A1 | 1/2020 | Tillotson, Jr. | |
| 2020/0025801 A1 | 1/2020 | Tadayon et al. | |
| 2021/0302489 A1 | 9/2021 | Tadayon | |

OTHER PUBLICATIONS

Luo, J.K. et al., "Young's modulus of electroplated Ni thin film for MEMS applications", Materials Letters, vol. 58, Issues 17-18, Jul. 2004, pp. 2306-2309.

Weeden, et al., "Probe Card Tutorial", www.tek.com/keithley, 2003, 40 pages, Keithley Instruments, Inc.

Wikipedia, "Probe Card", last edited on Jul. 29, 2016, 2 pages, Wikipeadia, https://en.wikipedia.org/wiki/probe_card.

* cited by examiner

METHOD AND APPARATUS TO DEVELOP LITHOGRAPHICALLY DEFINED HIGH ASPECT RATIO INTERCONNECTS

BACKGROUND

In microelectromechanical system (MEMS) and microelectronics packaging, there is a growing demand for high-aspect ratio metal structures, often electroplated into deep apertures made in thick photoresist coatings, to be integrated into the package substrates. These structures may be in the form of vias and other types of electrical interconnects, as well as mechanical structures. Development of high-aspect ratio apertures in thick photoresist has proven to be problematic. Mass transfer of developer into and out of the high-aspect ratio apertures is limited by diffusion, which is often too slow to be practical for most package manufacturing. Current attempts to increase mass transfer by increasing bulk agitation or localized ultrasonic agitation do not perceptively improve intra-aperture mass transfer, and in the case of ultrasonic agitation, may cause delamination of the photoresist coating.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
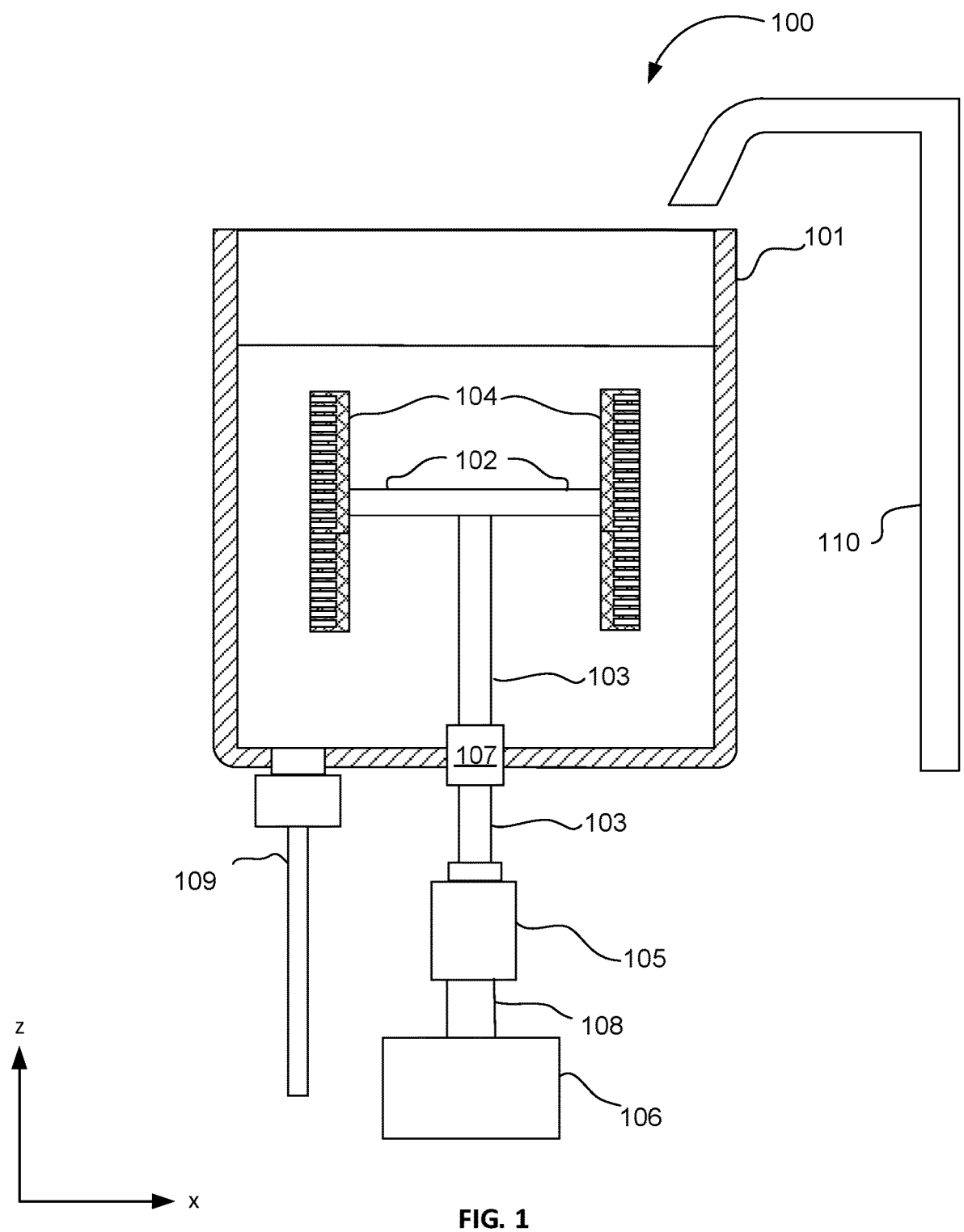
FIG. 1 illustrates a cross-sectional view of a high-aspect ratio lithography development tool, according to some embodiments of the disclosure.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Here, the term "package" generally refers to a self-contained carrier of one or more dies, where the dies are attached to the package substrate, and encapsulated for protection, with integrated or wire-boned interconnects between the die(s) and leads, pins or bumps located on the external portions of the package substrate. The package may contain a single die, or multiple dies, providing a specific function. The package is usually mounted on a printed circuit board for interconnection with other packaged ICs and discrete components, forming a larger circuit.

Here, the term "dielectric" generally refers to any number of non-conductive materials that make up the structure of a package substrate. For purposes of this disclosure, dielectric material may be incorporated into an IC package as layers of laminate film or as a resin molded over IC dies mounted on the substrate.

Here, the term "metallization" generally refers to metal layers formed over the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in microelectronic packages and dies. The term "solder pad" may be occasionally substituted for "bond pad", and carries the same meaning.

Here, the term "solder bump" generally refers to a solder layer formed on a bond pad. The solder layer typically has a round shape, hence the term "solder bump".

Here, the term "probe" generally refers to a wire or elongated tip or lead extending from a test instrument. Most simply, a probe is contacted to a point in a circuit, typically for measurement of voltages at circuit points of a device under test (DUT). If two or more probes are used in concert, currents and voltages may be measured at the same time. In the context of this disclosure, a probe is a part of a probe array, where multiple probe wires are arranged in an array carried on a carrier substrate referred to as a "card". The probe array is arranged to contact partial or entire arrays of solder bumps or bond pads on integrated circuit (IC) die or package substrate DUTs. Thus, the spacing or pitch between probes must be commensurate with the bump or pad pitch on the DUT. Each probe in a probe array is individually addressable.

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "high density" generally refers to metallization structure arrays having center-to-center pitches below 100 microns in one or both dimensions. Metallization structure arrays include bond pad arrays, solder bump arrays on package substrates and dies. However, the definition is extended to include probe arrays. Current industry trends target center-to-center pitches of 30 microns and below. The small array pitch dimensions allow development of bond pad or solder bump arrays having tens of thousands of individual pads or bumps.

Here, the term "high-aspect ratio" generally refers to apertures having an aspect ratio of 10:1 or greater.

Disclosed herein is an apparatus and method for developing deep lithographically defined apertures in thick photoresists. The disclosed apparatus and method facilitate formation of high-aspect ratio metal microstructures such as vias or other types of electrical interconnects, as well as mechanical MEMS structures, that are electroplated into the deep apertures in a thick (e.g., greater than 50 microns) photoresist. The disclosed apparatus comprises a rotatable shaft and substrate fixtures coupled to the rotatable shaft by an arm. The disclosed apparatus further comprises a vessel. The vessel may be a container or tank for holding a liquid photoresist developer solution, into which the substrate fixtures are immersed during operation. In some embodiments, the rotatable shaft extends through the bottom of the vessel into its interior. A gland may be employed to seal the rotatable shaft at the point of entry into the vessel. In some embodiments, the rotatable shaft is a separate part that is introduced into the vessel from an opening at the top of the vessel. In some embodiments, the vessel is an open tank. In some embodiments, the vessel comprises a cap having an opening through which the rotatable shaft extends into the interior of the vessel.

In some embodiments, one or more arms extend laterally from the rotatable shaft for a distance that is less than the radius of the vessel if the vessel has a circular cross-section, or for a distance that is smaller than the smallest x-y dimension of the vessel. In some embodiments, substrate fixtures are coupled to the arm at or near the distal end of the one or more arms. In some embodiments, the one or more arms extend orthogonally from the rotatable shaft. In some embodiments, the one or more arms are distributed at regular angular intervals about the rotatable shaft.

In some embodiments, the rotatable shaft is coupled to a motor. In some embodiments, the motor can be statically or dynamically configured, and in some embodiments, the motor is coupled to a control circuitry. In some embodiments, the control circuitry is operable by a programmable processor. In some embodiments, the control circuitry is manually operable.

The disclosed method comprises developing a thick photoresist that has been exposed to a photomask pattern. The disclosed method comprises mounting at least one substrate on the substrate fixture, wherein the substrate is coated with a thick photoresist (from 50 to 5000 microns) that has been exposed to a photomask pattern. The at least one substrate is immersed in a vat of photoresist developer contained within the vessel. The method further comprises activating the motor to rotate the shaft according to a predetermined angular speed profile. The predetermined angular speed profile comprises stopping the rotation for a first predetermined time period, then restarting the rotation for a second predetermined time period. The duration of the predetermined time period and the rotational speed are variable. In some embodiments, the rotatable shaft is cyclically rotated at a predetermined rotational speed according to a predetermined duty cycle.

The rationale of the disclosed method is explained as follows. As small apertures develop and bore into the photoresist coating, developer diffuses into the deepening apertures. Many developers comprise solvents that dissolve the non-cross-linked photoresist material without being consumed, or comprise base or acid components that may be consumed during the dissolution process. Under passive fluidic dynamic regimes, where there is substantially no agitation or mixing, the rate of diffusion of fresh developer into the lower reaches of high-aspect ratio apertures slows or ceases. The concentration of dissolution products within the deepening apertures may increase to the point of re-deposition of the photoresist material. The dissolution products are generally high molecular weight polymeric fragments, and as such, have relatively slow diffusion rates towards the mouths of the apertures and into the bulk developer.

To circumvent these limitations, the disclosed method comprises periodically rotating the one or more substrates at rotational speeds to create centrifugal forces on liquid and solid materials within the high-aspect ratio apertures. According to embodiments of the disclosure, the centrifugal forces are sufficient to physically expel these materials from the interior of the apertures. The one or more substrates are rotated (spun) at a predetermined rotational velocity for a first predetermined time period, then rotation is halted for a second predetermined time period.

During rotation of the one or more substrates above a critical rotational velocity, developer is ejected from the high-aspect ratio apertures, creating a vacuum with the apertures. Developer exiting the apertures carry away dissolution products and any solid materials that may be suspended within the liquid developer. For the duration of the rotational (first) time period, the vacuum created within the high-aspect ratio apertures provides a weak centripetal force that is more than counterbalanced by the centrifugal force generated by the rotation.

During the second predetermined time period, where rotation is halted, the centrifugal force is removed, and the vacuum within the high-aspect ratio apertures forces fresh developer into the interior of the apertures. The initial concentration profile along the axis of the high-aspect ratio apertures is substantially constant. At the bottom of the apertures, the fresh developer attacks undissolved material, establishing a concentration profile within the aperture interior anew, consuming developer and/or increasing the concentration of dissolution products. According to some embodiments of the disclosure, the dissolution process is permitted to continue for a prescribed time period. At the end of the prescribed time period, which, according to some embodiments, is the second predetermined time period, rotation is resumed, and the process is repeated.

According to some embodiments, the first and second predetermined time periods are cyclically repeated for a predetermined number of cycles. The first and second predetermined time periods may be described as on/off segments of a duty cycle. According to some embodiments, the disclosed method comprises cycling the on/off rotational periods (first and second predetermined time periods) for a number of duty cycles until a predetermined aperture depth is reached.

According to some embodiments, the rotational speed is predetermined to establish a known centrifugal force on the fluid contained within the high-aspect ratio apertures. As the high-aspect ratio apertures deepen, the centrifugal force necessary to completely eject the developer may increase. The first and second time period segments of the duty cycle may also increase as the apertures develop. Based on parameters such as aspect ratio, aperture diameter, aperture depth, dissolution kinetics and fluid density, the centrifugal force and thus the rotational velocity and duration required to produce it may be calculated. In some embodiments, rotational velocity and duration are determined empirically, based on measurable rates of aperture development.

Once determined, velocity and time parameters may be programmed into the motor control circuitry, providing automated control of the development duty cycles, according to some embodiments.

The disclosed method provides improved development of high-aspect ratio apertures in thick photoresists, where the aspect ratio is greater than 10. In contrast to conventional methods, the disclosed method shortens the development time for a given aperture diameter and aspect ratio. The shortened exposure of the thick photoresist to developer mitigates lateral attack of the aperture sidewalls, as normally observed in conventional thick photoresist lithography. In addition, the disclosed method does not increase the risk of delamination of the photoresist, as is the case with ultrasonic agitation. The disclosed method also makes possible deeper apertures, having aspect ratios ranging up to 100.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

FIG. 1 illustrates a cross-sectional view of a first embodiment of high-aspect ratio lithography development tool 100, according to some embodiments of the disclosure.

In FIG. 1, high-aspect ratio lithography development tool 100 comprises vessel 101, support structures 102, shaft 103, substrate fixtures 104 coupled to support structures 102, motor 105 coupled to the proximal end of shaft 103, and motor drive circuitry 106. In some embodiments, the distal end of shaft 103 extends into the interior of vessel 101 through gland 106 at the bottom of vessel 101. Gland 106 provides a liquid seal for shaft 103. In the interior of vessel 101, shaft 103 is coupled to support structures, referred to as extender arms 102, extending laterally from shaft 103. At the distal end of extender arms 102 are substrate mounting fixtures 104. In some embodiments, substrate mounting fixtures 104 are conductive. During operation of high-aspect ratio lithography development tool 100, shaft 103 is caused to rotate by motor 105 at high angular velocities in a liquid developer contained in vessel 101. In some embodiments, substrate mounting fixtures 104 are angularly distributed about shaft 103 in a manner to balance forces acting on shaft 103 during rotation. In the illustrated embodiment, substrate mounting fixtures are positioned at an angular interval of 180°. However, other angular intervals may be used. For example, substrate mounting fixtures are positioned at an angular interval in a range of 150 to 200 degrees.

In some embodiments, vessel 101 has a circular cross-section. In some embodiments, vessel 101 has a rectilinear cross-section. Extender arms 102 have a length that is less than the radius or smallest cross-sectional dimension of vessel 101 to allow adequate spacing between substrate mounting fixtures 104 and the wall of vessel 101. Shaft 103 is coupled to motor 105. In some embodiments, motor 105 is exterior to vessel 101. In some embodiments, motor 105 is coupled to motor drive circuitry 106 through cable 107. In some embodiments, motor drive circuitry comprises a programmable microprocessor. In some embodiments, motor 105 is a direct current (DC) motor. In some embodiments, motor 105 is an alternating current (AC) motor. In some embodiments, motor 105 is a stepper motor.

In some embodiments, drain tube 108 is coupled to vessel 101 for draining spent developer from vessel 101. In some embodiments, fresh developer is added to vessel 101 by external tubing 109.

Figure 2:
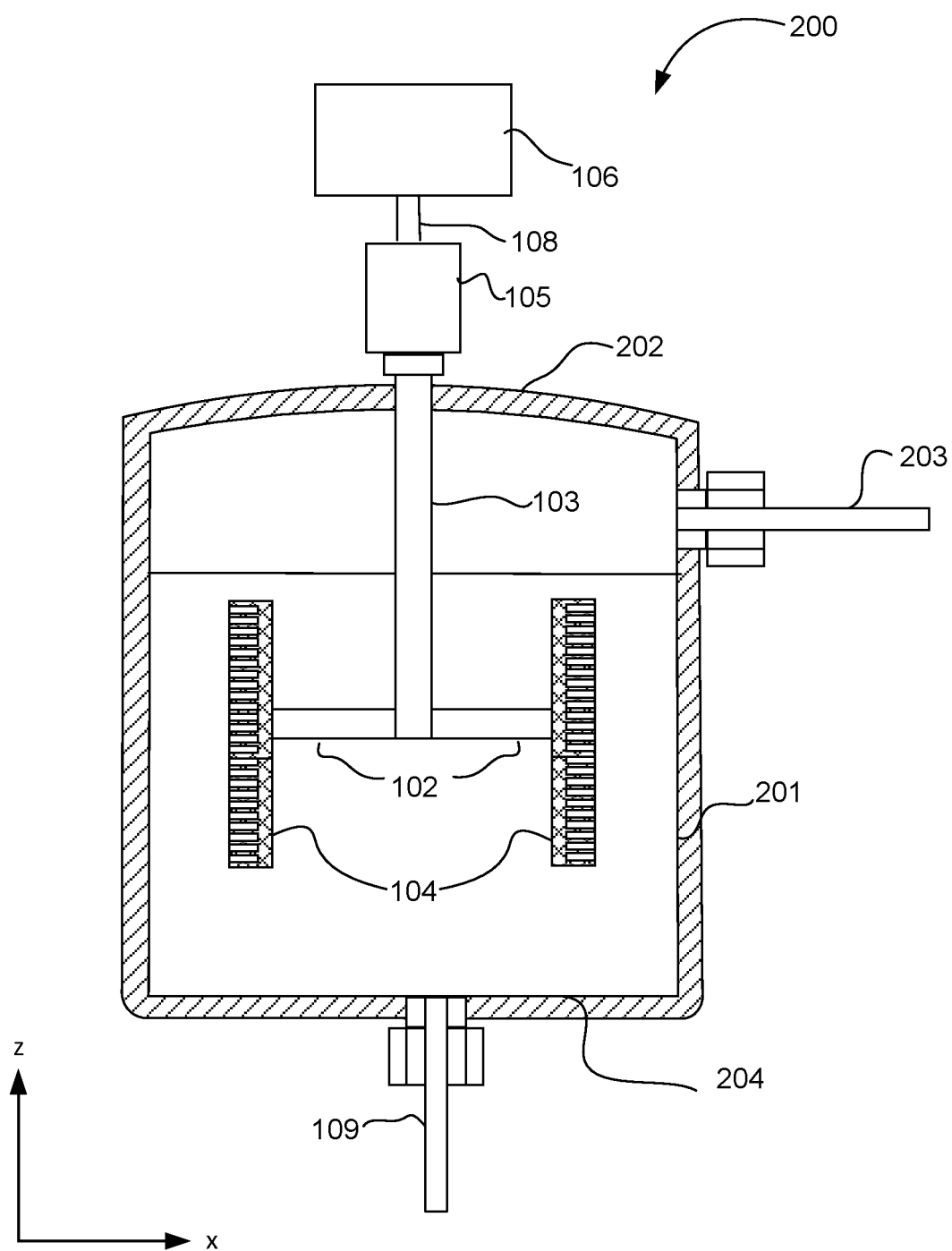
FIG. 2 illustrates a cross-sectional view of a high-aspect ratio lithography development tool, according to some embodiments of the disclosure.

FIG. 2 illustrates a cross-sectional view of a second embodiment of high-aspect ratio lithography development tool 200, according to some embodiments of the disclosure.

In FIG. 2, high-aspect ratio lithography developer tool 200 comprises vessel 201, shaft 103 extending through vessel cover 202, extender arms 102, and substrate fixtures 104. In some embodiments, substrate fixtures 104 are circular. In some embodiments, substrate fixtures are rectilinear. Shaft 103 extends into vessel 201 through vessel cover 202. Shaft 103 comprises materials generally compatible with organic solvents, mild acids and bases. Suitable materials include, but are not limited to, stainless steel, titanium, and thermoplastic materials such as polysulfones (e.g., PAS, PES), polyether ether ketone (PEEK) and polyetherimide (PEI, e.g., Ultem). In the illustrated embodiment, a shaft seal, such as gland 106 in FIG. 1, is not required. In some embodiments, drain tube 108 is at the bottom of vessel 201. In some embodiments, feed tube 203 enters vessel 101 near the top for introduction of developer into vessel 201 through feed tube 203.

Vessel 201 comprises materials generally compatible with organic solvents, mild acids and bases. In some embodiments, vessel 201 comprises materials such as, but not limited to, borosilicate glass, polypropylene, polytetrafluoroethylene (PTFE), polyethylene terephthalate (PETP), and polyetherimide (PEI, e.g., Ultem).

Figure 3A:
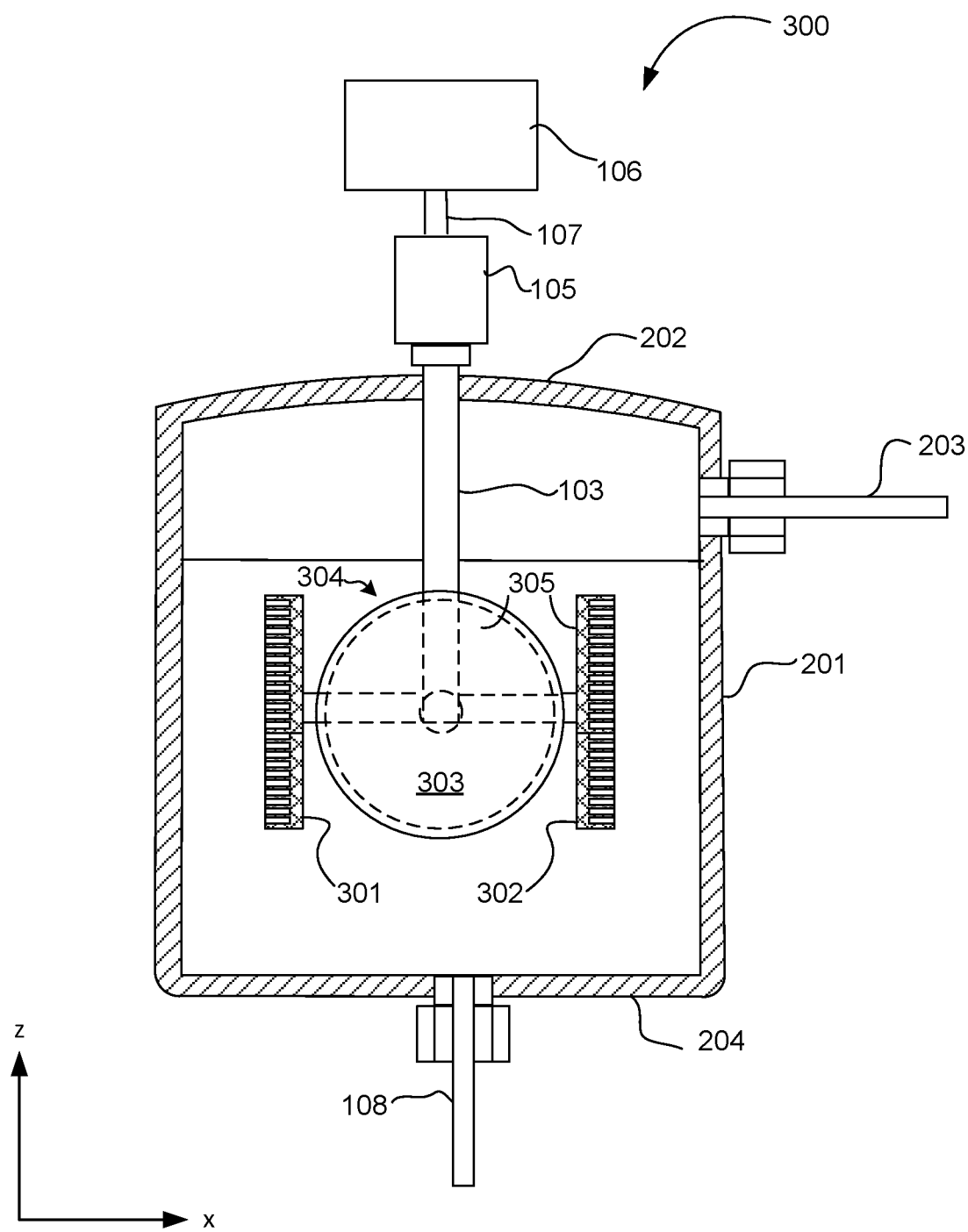
FIG. 3A illustrates a cross-sectional view of a high-aspect ratio lithography development tool, according to some embodiments of the disclosure.

FIG. 3A illustrates a cross-sectional view of a third embodiment of high-aspect ratio lithography development tool 300, according to some embodiments of the disclosure.

In some embodiments, high-aspect ratio lithography development tool 300 comprises multiple substrate fixtures (e.g., more than two). In FIG. 3A, high-aspect ratio lithography development tool 300 comprises four orthogonally oriented substrate fixtures, 301, 302, 303 and 304. Substrate fixtures 301 and 302, shown in profile, are orthogonal to substrate fixtures 303 and 304. Substrate fixture 304 is behind front-facing substrate fixture 303, and is shown by the dashed circular outline. In some embodiments, substrate fixtures 301-304 are distributed spatially in a balanced manner. In the illustrated embodiment, substrate fixtures are distributed at regular intervals (e.g., 90° intervals). Balanced distribution of substrate fixtures may mitigate mechanical instabilities when shaft 103 is rotated at high speed. In some embodiments, substrate fixtures 301-304 are circular. In some embodiments, substrate fixtures 301-304 are rectilinear.

In some embodiments, substrate fixtures 301-304 comprise a plate backing 305, and clips (not shown) for holding a substrate fast to plate backing 305. In some embodiments, substrate fixtures 301-304 comprise a perimeter clamp (not shown). Substrate fixtures 301-304 are coupled to the distal end of extender arms, shown as hidden lines behind substrate fixture 303.

In the illustrated embodiment, shaft 103 inserts into vessel 201 from the top, through cover 202, and extends downward toward base 204 of vessel 201. Substrate fixtures 301-304 couple to shaft 103 through the extender arms (shown in FIG. 3B). Above vessel 201, shaft 103 couples to motor 105. In some embodiments, motor 105 is coupled to motor drive control circuitry 106 through cable 107.

In some embodiments, feed tube 203 extends from the wall of vessel 201 near the top of vessel 201. In some embodiments, drain tube 108 extends from base 204. In some embodiments, feed tube 203 and drain tube 108 are employed to enable closed circuit cycling of developer. Fresh developer may be introduced through feed tube 203, while spent developer may be removed through drain tube 108.

Figure 3B:
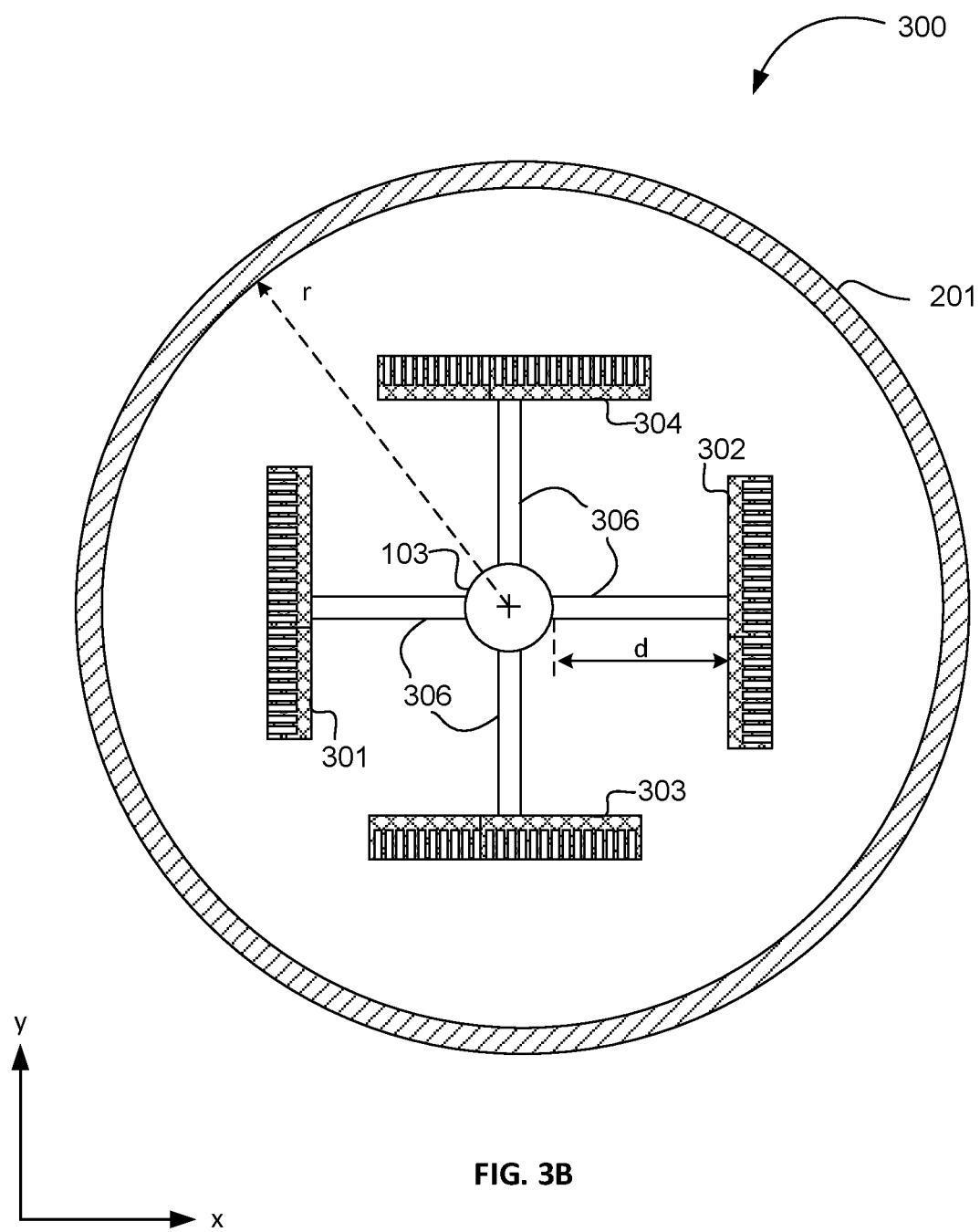
FIG. 3B illustrates a plan view of the high-aspect ratio lithography development tool of FIG. 3A, having a four-substrate capacity, according to some embodiments of the disclosure.

FIG. 3B illustrates a plan view of a third embodiment of high-aspect ratio lithography development tool 300 having a four-substrate capacity, according to some embodiments of the disclosure.

In FIG. 3B, the plan view shows features of high-aspect ratio lithography development tool 300 indicated by hidden lines in FIG. 3A. Support structures (hereinafter referred to as extender arms) 306 are distributed at regular intervals (e.g., 90° intervals) about shaft 103, permitting a four-substrate capacity. In some embodiments, a 90° angular interval is a balanced distribution of the four substrate mounting fixtures 301-304. Substrate mounting fixtures 301, 302, 303 and 304 are coupled to the distal ends of extender arms 306. In some embodiments, the length d of extender arms 306 is proportionate to the radius r of vessel 201. In some embodiments, the proportionality of the length d of extender arms 306 to the radius r of vessel 201 is optimized so that the wall of vessel 201 does not interfere with substrate mounting fixtures 301-304.

Figure 4:
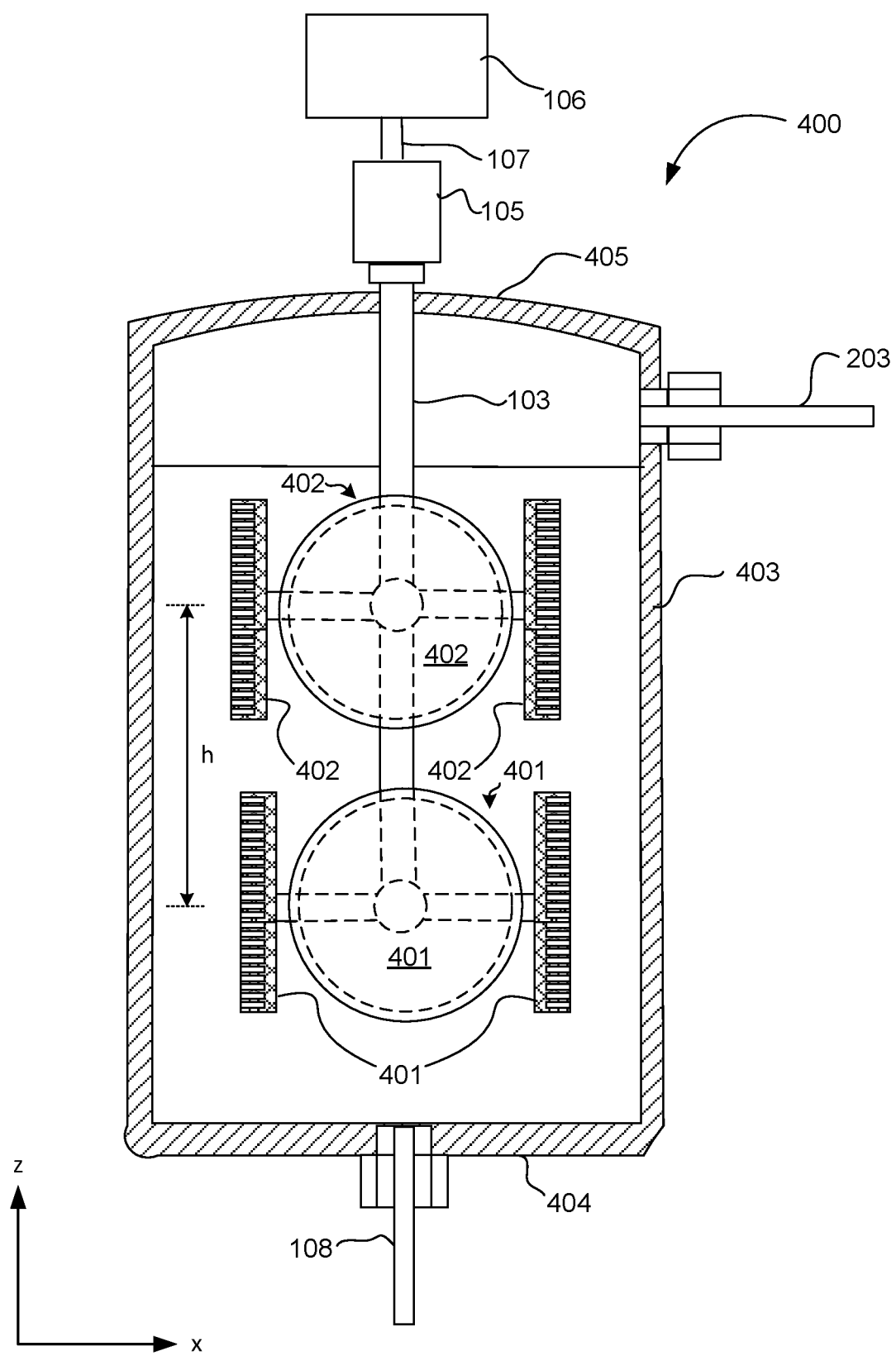
FIG. 4 illustrates a profile view of a high-aspect ratio lithography development tool, having an eight-substrate capacity, according to some embodiments of the disclosure.

FIG. 4 illustrates a profile view of a fourth embodiment of high-aspect ratio lithography development tool 400 having an eight-substrate capacity, according to some embodiments of the disclosure.

In FIG. 4, high-aspect lithography development tool 400 comprises a first tier of four substrate mounting fixtures 401, positioned at the base of shaft 103, and a second tier of four substrate mounting fixtures 402, positioned along shaft 103 at a z-height h relative to base of shaft 103. The double-tier arrangement permits up to eight substrates to be developed simultaneously. Vessel 403 has a larger z-height than vessel 201 in FIG. 3A to accommodate the second tier of substrate mounting fixtures 402. In some embodiments, high-aspect lithography development tool 400 comprises additional tiers of substrate mounting fixtures along shaft 103.

Hidden lines in FIG. 4 show hidden portions of shaft 103 and extender arms (e.g., 306 in FIG. 3B) that couple substrate mounting fixtures 401 and 402 to shaft 103. In some embodiments, shaft 103 extends above vessel 403 through cover 405. Shaft 103 is coupled to motor 105 external to vessel 403. In some embodiments, motor 105 is coupled to motor drive circuitry 106 through cable 107.

In some embodiments, high-aspect lithography development tool 400 comprises feed conduit 203, providing an inlet for adding developer to vessel 403. In some embodiments, drain conduit 108 extends from base 404 of vessel 403, providing an outlet to drain spent developer from vessel 403.

Figure 5A:
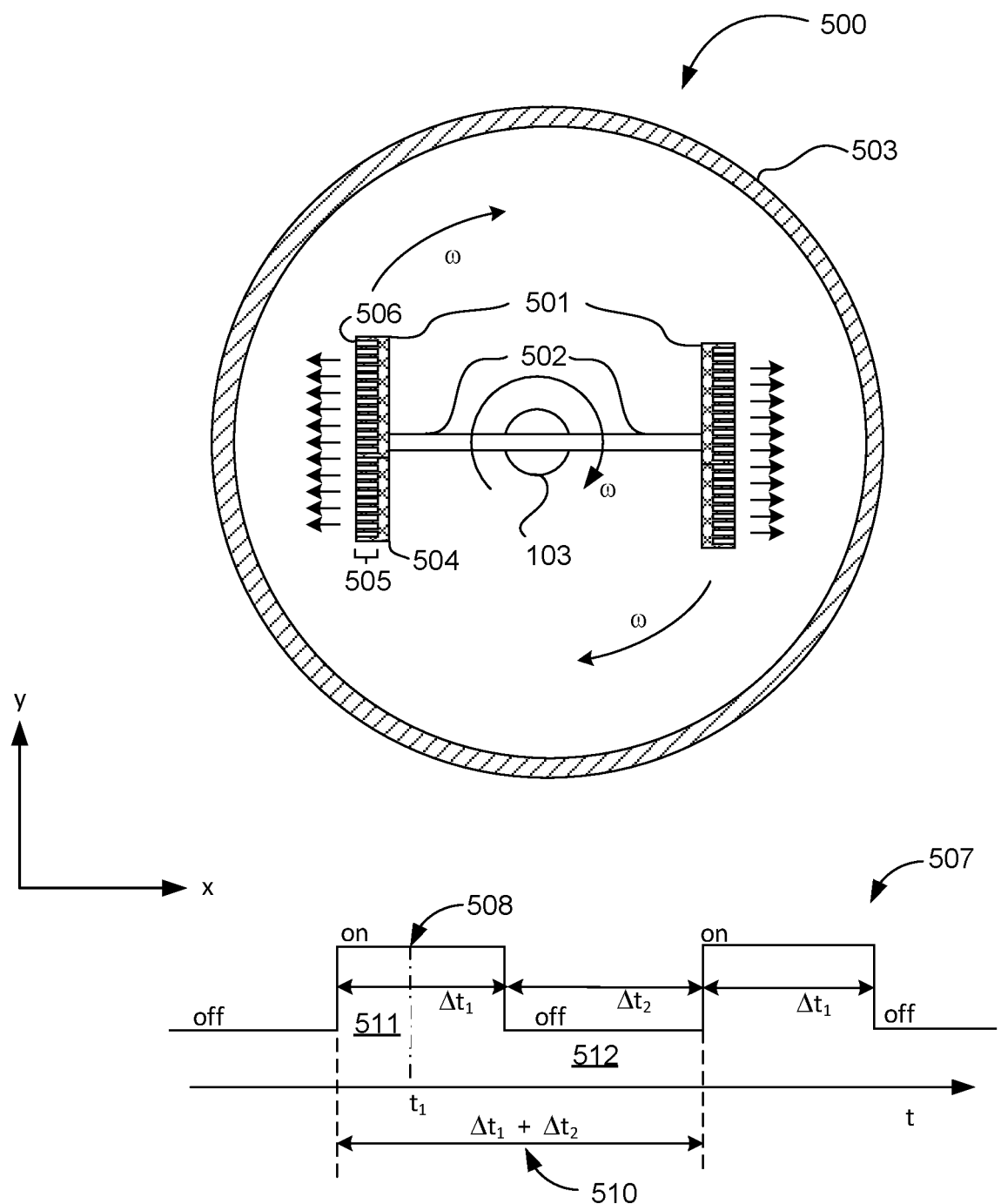
FIG. 5A illustrates a plan view of a high-aspect ratio lithography development tool, during a first phase of operation for development of high-aspect ratio apertures in a thick photoresist, according to some embodiments of the disclosure.

FIG. 5A illustrates a plan view of high-aspect ratio lithography development tool 500 during a first phase of operation for development of high-aspect ratio apertures in a thick photoresist, according to some embodiments of the disclosure.

In FIG. 5A, high-aspect ratio lithography development tool 500 comprises substrate mounting fixtures 501 coupled to the distal ends of extender arms 502. Extender arms 502 are distributed about shaft 103 at a 180° angular interval. The assembly comprising substrate mounting fixtures 501, extender arms 502 and shaft 103 are within the interior of vessel 503. Substrates 504 are on substrate mounting fixtures 501, where substrates 504 are coated with a thick photoresist 505. [What is the range of the thickness?] High aspect ratio apertures 506 are in the process of developing in thick photoresist 505. In the embodiment illustrated in FIG. 5A, vessel 503 is filled with photoresist developer.

A first phase of operation of high-aspect ratio lithography development tool 500 is shown in FIG. 5A, where shaft 103 is undergoing rotation at a predetermined rotational velocity ω. FIG. 5A shows a snapshot of the development process, marked in time by duty cycle trace 507. Position 508 along duty cycle trace 507 indicates the point $t_1$ at which the snapshot is taken. Duty cycle trace 507 depicts an exemplary train of more than one duty cycle 510. Duty cycle 510 comprises "on" segment 511, where shaft 103 is in rotation, and "off" segment 512, where shaft 103 is at rest. In some embodiments, "on" segment 511 has duration $\Delta t_1$, and "off" segment 512 has duration $\Delta t_2$.

Duty cycle trace 507 depicts a train of duty cycles 510, each duty cycle 510 indicating periodic rotation for a duration of $\Delta t_1$, and rest of shaft 103 for a duration of $\Delta t_2$. Duty cycle train 507 graphically indicates repetitive cyclic operation of shaft 103, where shaft 103 undergoes multiple cycling of rotation and rest. In some embodiments, durations $\Delta t_1$ and $\Delta t_2$ are progressively varied during the duration or duty cycle train 507. In some embodiments, rotational speed ω is progressively varied during the duration of duty cycle train 507. In some embodiments, durations $\Delta t_1$ and $\Delta t_2$ and rotational speed ω are progressively varied during the duration of duty cycle train 507. In some embodiments, the duration of duty cycle train 507 is determined by the time required to complete development of high-aspect ratio apertures 506. In some embodiments, the duration of duty cycle train 507 is determined a priori by empirical measurements.

The groups of arrows adjacent to substrates 504 indicate expulsion of developer from high-aspect ratio apertures 506, due to the centrifugal force applied to the columns of developer contained within high-aspect ratio apertures 506. In some embodiments, emptying of high-aspect ratio apertures 506 creates a pressure differential between the interior of high-aspect ratio apertures 506 and the bulk developer volume. In some embodiments, a vacuum is created within the interior of high-aspect ratio apertures. The following example demonstrates the forces generated within high-aspect ratio apertures 506 when the substrate is spun at 5000 rotations per minute (rpm).

For an aperture having a diameter of 20 microns and depth of 300 microns, at a rotation speed $\omega$ of 5000 min$^{-1}$ (~49 m/s) and extension arm length of 7.5 cm (3 inches), an acceleration of more than 2000 g's is applied to a plug of developer having a mass of approximately $9 \times 10^{-11}$ kg (generating $1.9 \times 10^{-6}$ N of force) of developer within each 20×300-micron aperture. The acceleration of 2000 g's is sufficient to eject the plug of developer from the 20×300-micron aperture.

Figure 5B:
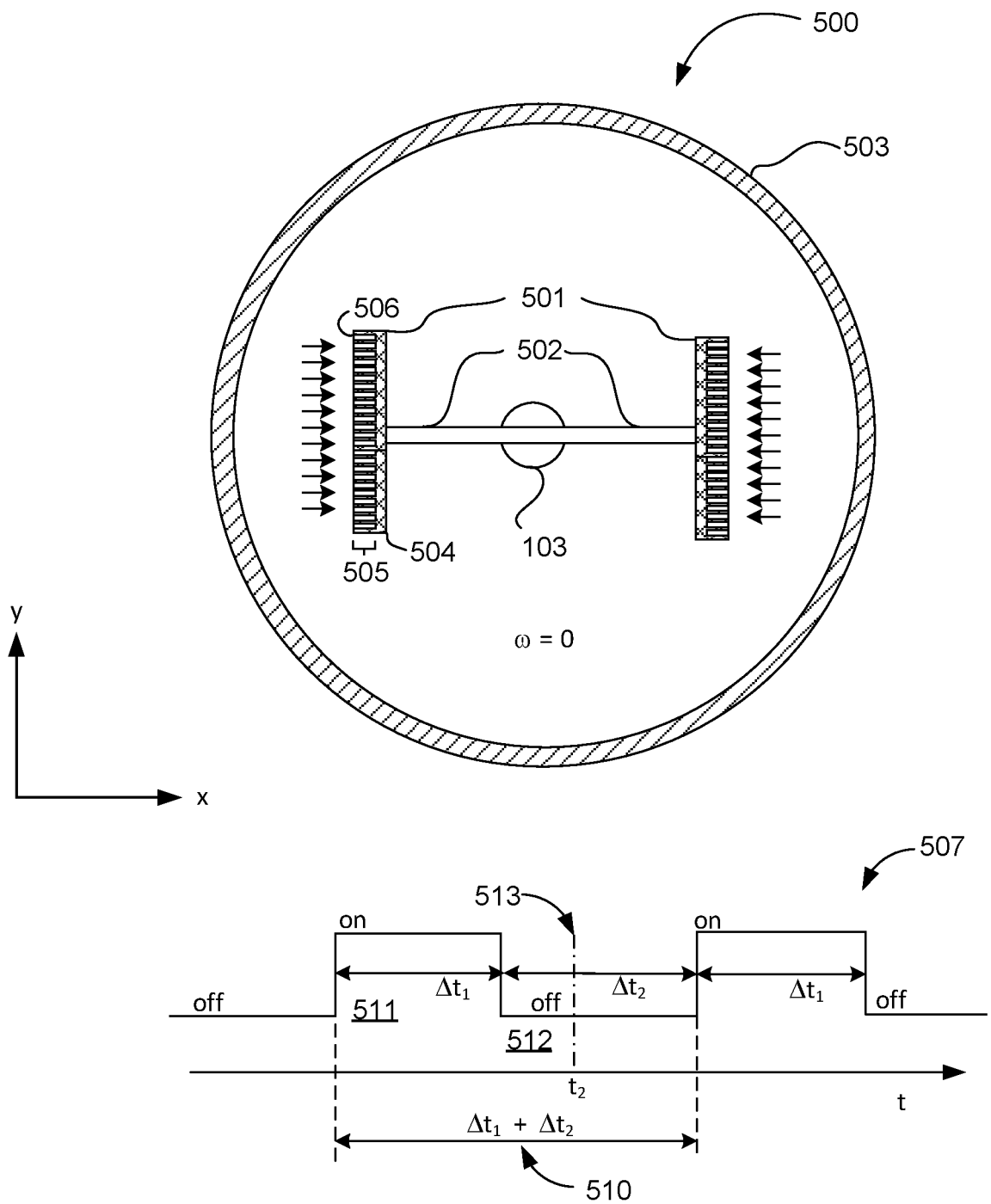
FIG. 5B illustrates a plan view of the high-aspect ratio lithography development tool, during a second phase of operation for development of high-aspect ratio apertures in a thick photoresist, according to some embodiments of the disclosure.

FIG. 5B illustrates a plan view of high-aspect ratio lithography development tool 500 during a second phase of operation for development of high-aspect ratio apertures in a thick photoresist, according to some embodiments of the disclosure.

In FIG. 5B, a second phase of operation of high-aspect ratio lithography development tool 500 is shown. The structural description of high-aspect ratio lithography development tool 500 is the same as described for FIG. 5A. In FIG. 5B, shaft 103 is caused to cease rotation. Substrates 504 are shown at rest. FIG. 5B shows a snapshot of the development process, marked at position 513 in "off" segment 512 of duty cycle 510 (duty cycle trace 507). Position 513 is taken at point $t_2$ within period $\Delta t_2$, demarking the duration of "off" segment 512.

Groups of arrows adjacent to substrates 504 indicate rapid flow of fresh developer back into empty high-aspect ratio apertures 506 when substrates 504 are at rest. The negative pressure differential (relative to the bulk developer volume) created between the interior volume of high-aspect ratio apertures 506 creates a suction, pulling bulk developer into the interior of high-aspect ratio apertures 506. In some embodiments, the periodic rotation of substrates 504 thoroughly mixes the bulk developer so that substantially fresh developer enters high-aspect ratio apertures 506.

Figure 6:
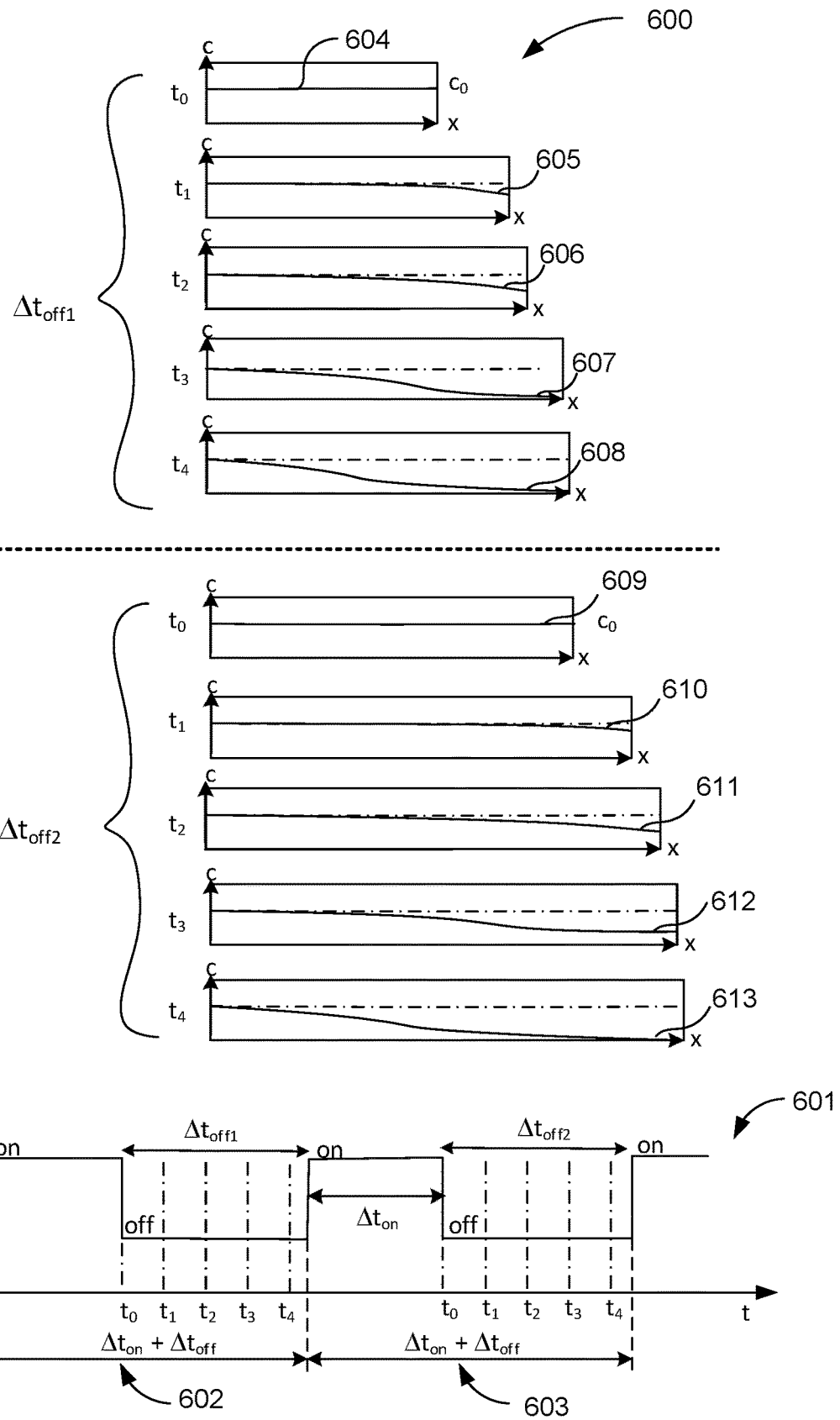
FIG. 6 illustrates a progression of time-dependent concentration profiles of a consumable ingredient in a plug of developer with a high-aspect ratio aperture, according to some embodiments of the disclosure.

FIG. 6 illustrates a progression of time-dependent concentration profiles of a consumable ingredient in a plug of developer with high-aspect ratio aperture 600, according to some embodiments of the disclosure.

In FIG. 6, snapshots of time-dependent concentration profiles of a depletable developer ingredient (e.g., water) in high-aspect ratio aperture 600 (hereinafter referred to as "aperture") is displayed as a series of plots of concentration c as a function of x, where x is the distance into aperture 600. The left side of the graphs coincide with x=0, the opening to aperture 600. The right side of the graphs coincide with the bottom of apertures 600. Distance x is a function of time, as shown by the increasing aperture depth in the x dimension. Referring to duty cycle train 601 at the bottom of FIG. 6, each plot displays the concentration profile, c(x), along the length of aperture 600. The snapshots are at different times, $t_0$, $t_1$, $t_2$, $t_3$ and $t_4$, taken at the same intervals during the "off" segments of two consecutive duty cycles 602 and 603, as indicated by the broken vertical lines within the "off" segments of duty cycle train 601, in segment $\Delta t_{off1}$ of duty cycle 602.

Referring again to duty cycle train 601, time $t_0$ occurs at the beginning of the "off" segment of duty cycle 602, when rotation ceases. Referring now to graph labeled $t_0$, fresh developer flows into aperture 600 with initial concentration $c_0$ of the depletable substance. Concentration profile 604 is a flat line, meaning the concentration is substantially constant $c_0$ throughout aperture 600. Referring now to the graph labeled $t_1$, concentration profile 605 begins to deplete at the bottom of aperture 600. Concentration profile 606 at $t_2$ is further depleted, where concentration profile 605 is bent further downward, and the departure from $c_0$ extends further along the length of aperture 600 toward the opening.

The trend continues at times $t_3$ and $t_4$, with depletion deepening and concentration profiles 607 and 608 having strong deviation from $c_0$ for a greater part of the length of aperture 600. All the while, aperture 600 continues to develop, as indicated by the increasing length of the abscissa of the graphs. The rate of development of aperture 600 is shown to slow, as indicated by smaller increases in the length in the x-dimension. This is accompanied by increasing departure of concentration profiles 606-608 from $c_0$, indicating increasing depletion in the deeper portions of aperture 600. The deep curvature of concentration profile 608 at the deeper reaches of aperture 600 indicate that the developer is mostly depleted at the bottom. The rate of development of aperture 600 is shown to be almost zero between times $t_3$ and $t_4$.

At this point, the duration $\Delta t_{off1}$ segment of duty cycle 602 ends. The operational phase switches to the "on" segment of duty cycle 603, where the substrates are rotated at high speed for a duration of $\Delta t_{on}$, to eject the developer within aperture 600. Referring again to duty cycle train 601, at the end of $\Delta t_{on}$, the operational phase enters the "off" segment $\Delta t_{off2}$, and rotation ceases.

The set of concentration profiles 609, 610, 611, 612 and 613 in the lower half of FIG. 6 correspond to times $t_0$-$t_4$, respectively, in segment $\Delta t_{off2}$ in duty cycle 603. At $t_0$, fresh developer at concentration $c_0$ enters into aperture 600 at the state of development completed at the end of duration $\Delta t_{off1}$. The concentration profile undergoes similar time-dependent evolution as experienced during duration $\Delta t_{off1}$. This is shown by the changes in concentration profiles 609-613, where increasing depletion occurs in the deeper regions of aperture 600 as the development proceeds. The length of aperture 600 increases during this phase, but the rate of development slows as depletion increases.

At the end of duration $\Delta t_{off2}$, duty cycle 603 is complete, and the next duty cycle starts with rotation of the substrates to eject the spent developer from aperture 600. In some embodiments, duty cycle train 601 continues until development of aperture 600 is complete. In some embodiments, development is complete when aperture 600 reaches a target length. In some embodiments, duty cycle train 601 comprises a predetermined number of duty cycles. The predetermined number of duty cycles may be empirically determined. In some embodiments, the duration of "on" segments and the duration of "off" segments are varied during the course of duty cycle train 601.

Figure 7:
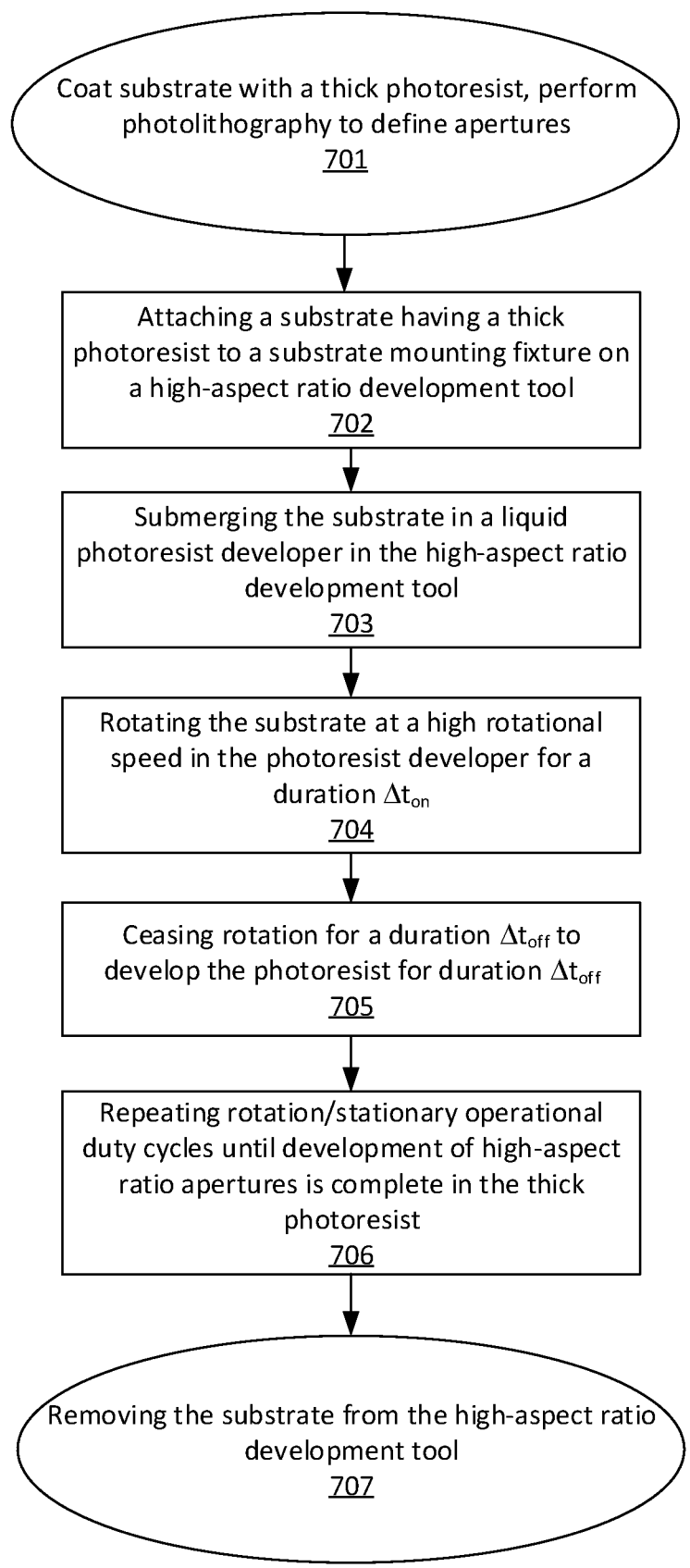
FIG. 7 illustrates a block diagram of a method of an exemplary operation of a high-aspect ratio development tool, according to some embodiments of the disclosure.

FIG. 7 illustrates a block diagram of method 700 of an exemplary operation of a high-aspect ratio development tool, according to some embodiments of the disclosure.

Referring to operation 701, a substrate is prepared for photolithography. The substrate is coated with a thick photoresist. In some embodiments, a high-viscosity epoxy resin photoresist, such as SU-8, is spin-coated on the substrate. In some embodiments, the photoresist is spray-coated on the substrate. In some embodiments, several layers of thick photoresist are applied to the substrate. In some embodiments, the photoresist thickness ranges between 50 microns and 5000 microns. The substrate may be circular or rectilinear in shape. After photoresist coating, the photoresist undergoes photolithography to define high-aspect ratio apertures.

Referring to operation 702, the substrate having the thick photoresist exposed through a photomask is mounted on a substrate mounting fixture on the high-aspect ratio development tool (e.g., 100 in FIG. 1, 400 in FIG. 4). The substrate mounting fixture is described above, and shown in FIGS. 1-5B (e.g., 104 in FIG. 1). Substrate mounting fixture has clips to mount an arbitrary-shaped substrate. In some embodiments, the substrate mounting fixture has a ring clamp for mounting round substrates, such as a wafer.

Referring to operation 703, the substrate mounting fixture and attached substrate are immersed in photoresist developer. In some embodiments, the high-aspect ratio development tool comprises a vessel or tank, into which photoresist developer is added. In some embodiments, the substrate mounting fixture is coupled to a rotatable shaft coupled to a motor, where the shaft extends into the vessel through the bottom of the vessel. In some embodiments, the rotatable shaft extends into the vessel from above the vessel. The substrate is stationary for a duration to initiate development of lithographically-defined apertures.

Referring to operation 704, the substrate is rotated by activating the rotatable shaft for a duration $\Delta t_{on}$. In some embodiments, the rotation is controlled by a motor drive circuitry controlling the motor coupled to the rotatable shaft. The rotation speed and duration $\Delta t_{on}$ are predetermined to create centrifugal force sufficient to force developer out of the developing aperture, and creating a pressure differential between the interior of the apertures and the bulk developer volume. In some embodiments, $\Delta t_{on}$ is a first phase of an operational duty cycle.

Referring to operation 705, rotation of the rotatable shaft and substrate is stopped after duration $\Delta t_{on}$. The substrate is stationary for a duration $\Delta t_{off}$. Initially, bulk developer is pulled into the apertures by suction due to the pressure differential. In some embodiments, the stationary duration $\Delta t_{off}$ is predetermined to allow the apertures to continue development. The length (depth) of the apertures increases during $\Delta t_{off}$, increasing the aspect ratio of the apertures. Developer within the apertures becomes depleted, and dissolution products build up within the interior of the apertures. In some embodiments, $\Delta t_{off}$ is a second phase of an operational duty cycle.

Referring to operation 706, the rotation/stationary operational duty cycle is repeated. In some embodiments, the number of operational duty cycles to complete the development of apertures to the required depth is predetermined. In some embodiments, the number of required operational duty cycles for complete development is measured in-situ by a sensor. In some embodiments, development is complete when the apertures reach a predetermined depth within the thick photoresist. In some embodiments, development is complete when the aperture extends through the thickness of the photoresist to the substrate.

Referring to operation 707, the substrate is removed from the high-aspect ratio development tool. The substrate is ready for transfer downstream in the process flow. In some embodiments, metal structures are electroplated into the resulting high-aspect ratio apertures in the thick photoresist. In some embodiments, high-aspect ratio vias are electroplated into the apertures. In some embodiments, high-aspect ratio wire probes are electroplated into the apertures.

Figure 8:
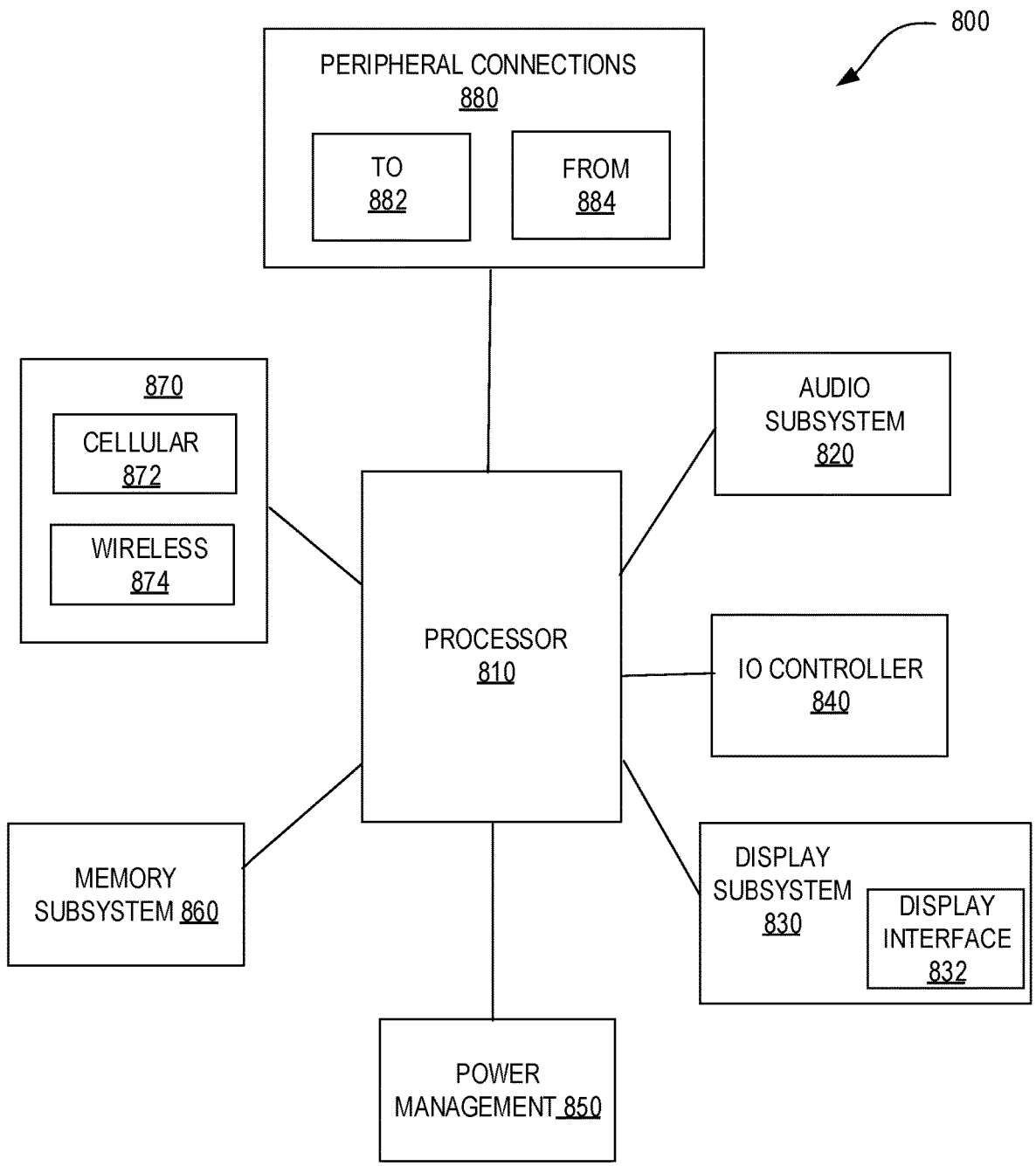
FIG. 8 illustrates a package having high-aspect ratio vias, fabricated according to the disclosed method, as part of a system-on-chip (SoC) package in an implementation of computing device, according to some embodiments of the disclosure.

FIG. 8 illustrates a package having high-aspect ratio vias, fabricated according to the disclosed method, as part of a system-on-chip (SoC) package in an implementation of computing device, according to some embodiments of the disclosure.

FIG. 8 illustrates a block diagram of an embodiment of a mobile device in which flat surface interface connectors could be used. In some embodiments, computing device 800 represents a mobile computing device, such as a computing tablet, a mobile phone or smart-phone, a wireless-enabled e-reader, or other wireless mobile device. It will be understood that certain components are shown generally, and not all components of such a device are shown in computing device 800.

In some embodiments, computing device 800 includes a first processor 810. The various embodiments of the present disclosure may also comprise a network interface within 870 such as a wireless interface so that a system embodiment may be incorporated into a wireless device, for example, cell phone or personal digital assistant.

In one embodiment, processor 810 can include one or more physical devices, such as microprocessors, application processors, microcontrollers, programmable logic devices, or other processing means. The processing operations performed by processor 810 include the execution of an operating platform or operating system on which applications and/or device functions are executed. The processing operations include operations related to I/O (input/output) with a human user or with other devices, operations related to power management, and/or operations related to connecting the computing device 800 to another device. The processing operations may also include operations related to audio I/O and/or display I/O.

In one embodiment, computing device 800 includes audio subsystem 820, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 800, or connected to the computing device 800. In one embodiment, a user interacts with the computing device 800 by providing audio commands that are received and processed by processor 810.

Display subsystem 830 represents hardware (e.g., display devices) and software (e.g., drivers) components that provide a visual and/or tactile display for a user to interact with the computing device 800. Display subsystem 830 includes display interface 832 which includes the particular screen or hardware device used to provide a display to a user. In one embodiment, display interface 832 includes logic separate from processor 810 to perform at least some processing related to the display. In one embodiment, display subsystem 830 includes a touch screen (or touch pad) device that provides both output and input to a user.

I/O controller 840 represents hardware devices and software components related to interaction with a user. I/O controller 840 is operable to manage hardware that is part of audio subsystem 820 and/or display subsystem 830. Additionally, I/O controller 840 illustrates a connection point for additional devices that connect to computing device 800 through which a user might interact with the system. For example, devices that can be attached to the computing device 800 might include microphone devices, speaker or stereo systems, video systems or other display devices, keyboard or keypad devices, or other I/O devices for use with specific applications such as card readers or other devices.

As mentioned above, I/O controller 840 can interact with audio subsystem 820 and/or display subsystem 830. For example, input through a microphone or other audio device can provide input or commands for one or more applications or functions of the computing device 800. Additionally, audio output can be provided instead of, or in addition to display output. In another example, if display subsystem 830 includes a touch screen, the display device also acts as an input device, which can be at least partially managed by I/O controller 840. There can also be additional buttons or switches on the computing device 800 to provide I/O functions managed by I/O controller 840.

In one embodiment, I/O controller 840 manages devices such as accelerometers, cameras, light sensors or other environmental sensors, or other hardware that can be included in the computing device 800. The input can be part of direct user interaction, as well as providing environmental input to the system to influence its operations (such as filtering for noise, adjusting displays for brightness detection, applying a flash for a camera, or other features).

In one embodiment, computing device 800 includes power management 850 that manages battery power usage, charging of the battery, and features related to power saving operation. Memory subsystem 860 includes memory devices for storing information in computing device 800. Memory can include nonvolatile (state does not change if power to the memory device is interrupted) and/or volatile (state is indeterminate if power to the memory device is interrupted) memory devices. Memory subsystem 860 can store application data, user data, music, photos, documents, or other data, as well as system data (whether long-term or temporary) related to the execution of the applications and functions of the computing device 800.

Elements of embodiments are also provided as a machine-readable medium (e.g., memory 860) for storing the computer-executable instructions. The machine-readable medium (e.g., memory 860) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 870 includes hardware devices (e.g., wireless and/or wired connectors and communication hardware) and software components (e.g., drivers, protocol stacks) to enable the computing device 800 to communicate with external devices. The computing device 800 could be separate devices, such as other computing devices, wireless access points or base stations, as well as peripherals such as headsets, printers, or other devices.

Network interface 870 can include multiple different types of connectivity. To generalize, the computing device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 874 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 880 include hardware interfaces and connectors, as well as software components (e.g., drivers, protocol stacks) to make peripheral connections. It will be understood that the computing device 800 could both be a peripheral device ("to" 882) to other computing devices, as well as have peripheral devices ("from" 884) connected to it. The computing device 800 commonly has a "docking" connector to connect to other computing devices for purposes such as managing (e.g., downloading and/or uploading, changing, synchronizing) content on computing device 800. Additionally, a docking connector can allow computing device 800 to connect to certain peripherals that allow the computing device 800 to control content output, for example, to audiovisual or other systems.

In addition to a proprietary docking connector or other proprietary connection hardware, the computing device 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an apparatus, comprising at least one vessel having a bottom and at least one sidewall extending from the bottom, wherein the at least one sidewall encloses an interior of the at least one vessel a shaft has a proximal end and a distal end, wherein the distal end of the shaft extends into the interior of the at least one vessel, wherein the proximal end of the shaft is coupled to a motor at least one support structure which extends laterally from the shaft; and a substrate attachment fixture on a distal end of the at least one support structure, wherein the at least one support structure and the substrate attachment fixture are within the interior of the at least one vessel.

Example 2 includes all of the features of example 1, wherein the motor is coupled to a control circuitry.

Example 3 includes all of the features of examples 1 or 2, wherein the shaft extends from the bottom of the at least one vessel into the interior of the at least one vessel.

Example 4 includes all of the features of any one of examples 1 through 3, wherein the shaft extends into the at least one vessel through an opening over the bottom of the at least one vessel.

Example 5 includes all of the features of any one of examples 1 through 4, wherein the at least one support structure comprises two or more support structures distributed angularly about the shaft at one distance from one end of the shaft.

Example 6 includes all of the features of any one of examples 1 through 5, wherein a first set of two or more support structures are distributed angularly about the shaft at a first distance from the distal end of the shaft, and a second set of two or more support structures are distributed angularly about the shaft at a second distance from the distal end of the shaft.

Example 7 includes all of the features of any one of examples 1 through 6, wherein the at least one vessel comprises a drain.

Example 8 includes all of the features of example 7, wherein the drain is coupled to a first conduit.

Example 9 includes all of the features of examples 7 or 8, wherein the drain is coupled to a pump.

Example 10 includes all of the features of any one of examples 1 through 9, wherein the at least one sidewall of the vessel comprises an inlet, and wherein the inlet is coupled to a second conduit.

Example 11 includes all of the features of example 10, wherein the second conduit is coupled to a pump.

Example 12 includes all of the features of examples 10 or 11, wherein the at least one vessel is a first vessel, and the second conduit is coupled to a second vessel.

Example 13 is a method comprising forming at least one vessel having a bottom and at least one sidewall extending from the bottom, wherein the at least one sidewall encloses an interior of the at least one vessel, extending a shaft into the interior of the at least one vessel, wherein the shaft is coupled to a motor, extending at least one support structure laterally from the shaft, and forming a substrate mounting fixture on a distal end of the at least one support structure, attaching a substrate to the substrate mounting fixture, wherein the substrate has a photoresist over the substrate, and wherein the photoresist is exposed to a predetermined dose of light energy through a photomask to form a lithographically defined pattern of openings to be developed in the photoresist, submerging the substrate in a liquid photoresist developer, wherein the liquid photoresist developer is contained within the at least one vessel, and spinning the substrate about the shaft in the liquid photoresist developer, wherein the shaft is cyclically rotated at a predetermined rotational speed according to a predetermined duty cycle.

Example 14 includes all of the features of example 13, wherein spinning the substrate about the shaft in the liquid photoresist developer, wherein the shaft is cyclically rotated at a predetermined rotational speed according to a predetermined duty cycle comprises cyclically rotating the shaft until the lithographically defined openings in the photoresist are developed.

Example 15 includes all of the features of examples 13 or 14, wherein the photoresist has a thickness, and wherein cyclically rotating the shaft until the lithographically defined openings in the photoresist are developed comprises cyclically rotating the shaft until the lithographically defined openings extend through the thickness of the photoresist to expose the substrate.

Example 16 includes all of the features of any one of examples 13 through 15, wherein cyclically rotating the shaft until the lithographically defined openings in the photoresist are developed comprises cyclically rotating the shaft until the bottoms of the lithographically defined openings are substantially planar with the substrate.

Example 17 includes all of the features of any one of examples 13 through 16, wherein spinning the substrate about the shaft in the liquid photoresist developer, wherein the shaft is rotated cyclically at a predetermined rotational speed for a predetermined time, comprises cyclically rotating the shaft at a predetermined rotational speed according to a duty cycle, wherein the duty cycle comprises rotating the shaft at a first predetermined time followed by stopping the rotation of the shaft for a second predetermined time.

Example 18 includes all of the features of example 17, wherein the first predetermined time and the second predetermined time are progressively changed during successive duty cycles.

Example 19 includes all of the features of any one of examples 13 through 18, wherein the predetermined rotational speed is progressively changed during successive duty cycles.

Example 20 includes all of the features of any one of examples 13 through 19, wherein spinning the substrate about the shaft in the liquid photoresist developer comprises commanding the motor to rotate the shaft at a predetermined rotational speed according to a predetermined duty cycle.

Example 21 includes all of the features of any one of examples 13 through 20, wherein attaching a substrate to the substrate attachment fixture comprises attaching a substrate to the substrate attachment fixture, wherein the photoresist over the substrate has a thickness of at least 20 microns.

Example 22 includes all of the features of any one of examples 13 through 21, wherein spinning the substrate about the shaft in the liquid photoresist developer comprises cyclically rotating the shaft and stopping the rotation of the shaft for a predetermined number of duty cycles.

Example 23 includes all of the features of any one of examples 13 through 22, wherein spinning the substrate about the shaft in the liquid photoresist developer comprises cyclically rotating the shaft until the development of the lithographic pattern is substantially complete.

Example 24 is a system comprising a memory; and a processor coupled to the memory, wherein the processor comprises a package having at least one high-aspect ratio via; and wherein the at least one high-aspect ratio via is electroplated into a thick photoresist, wherein the thick photoresist is developed in a high-aspect ratio tool, and wherein the high-aspect ratio tool comprises at least one vessel having a bottom and at least one sidewall extending from the bottom, wherein the at least one sidewall encloses an interior of the at least one vessel, a shaft which extends into the interior of the at least one vessel, wherein the shaft is coupled to a motor, at least one support structure which extends laterally from the shaft; and a substrate attachment fixture on a distal end of the at least one support structure, wherein the at least one support structure and the substrate attachment fixture are within the interior of the at least one vessel, wherein the processor is coupled to a wireless transceiver for wireless communication with an external device.

Example 25 includes all of the features of example 24, wherein the at least one high-aspect ratio via has an aspect ratio of at least 10:1.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. A photoresist developing apparatus, comprising:
    a vessel having a bottom and a sidewall extending from the bottom and enclosing an interior of the vessel within which a liquid photoresist developer is to be contained;
    a shaft having a proximal end and a distal end, wherein the distal end extends into the interior of the vessel;
    a motor external of the vessel and coupled to rotate the proximal end of the shaft;
    a plurality of support arms that extend radially from the shaft at a first distance from the distal end of the shaft, wherein the plurality of support arms are to be immersed in the developer at angles about the shaft to balance forces acting on the shaft during rotation; and
    a substrate mount on a distal end of each of the support arms, wherein the substrate mount is to hold a substrate immersed in the developer with a layer of photoresist on the substrate facing away from the shaft.

2. The apparatus of claim 1, wherein the motor is coupled to a control circuitry to rotate the shaft at a predetermined rate of rotation for predetermined time periods according to a predetermined rotation duty cycle.

3. The apparatus of claim 1, wherein the shaft extends from the bottom of the vessel into the interior of the vessel.

4. The apparatus of claim 1, wherein two or more support structures are distributed angularly about the shaft at the first distance from the distal end of the shaft.

5. The apparatus of claim 4, wherein a second set of two or more support structures are distributed angularly about the shaft at a second distance from the distal end of the shaft.

6. The apparatus of claim 1, wherein the vessel comprises a drain.

7. The apparatus of claim 6, wherein the drain is coupled to a first conduit.

8. The apparatus of claim 6, wherein the at least one sidewall of the vessel comprises an inlet, and wherein the inlet is coupled to a second conduit.

9. The apparatus of claim 1, wherein plurality of support arms comprise a first pair of support arms at the first distance from the distal end of the shaft, and positioned about the shaft at an angular interval of 180°.

10. The apparatus of claim 9, wherein the plurality of support arms further comprise a second pair of support arms at the first distance from the distal end of the shaft and positioned about the shaft at an angular interval of 180° with an angular interval of 90° between each of the first pair of support arms and each of the second pair of support arms.

11. The apparatus of claim 1, wherein:
    the support arms extend substantially perpendicular to the shaft; and
    the substrate mounts are substantially parallel to the shaft.

12. The apparatus of claim 11, wherein the substrate mounts are circular.

13. The apparatus of claim 1, further comprising motor control circuitry to control the motor to rotate the shaft according to a predetermined angular speed profile.

14. The apparatus of claim 13, wherein the predetermined angular speed profile comprises no rotation for a first predetermined time period, and rotation for a second predetermined time period.

15. The apparatus of claim 14, wherein the duration of the predetermined time periods and a rotational speed are variable according to a predetermined duty cycle.

16. The apparatus of claim 15, wherein the first predetermined time period is sufficient to allow one or more apertures in the layer of photoresist to develop.

17. The apparatus of claim 16, wherein the rotational speed is to create a centrifugal force sufficient to force developer out of the apertures.

18. The apparatus of claim 1, wherein the motor is to rotate the shaft a rotation speed sufficient to subject the substrate to an acceleration of at least 2000 G.

* * * * *